Sept. 28, 1965 R. S. BURWEN 3,209,277
ELECTRONIC APPARATUS
Filed Sept. 15, 1961
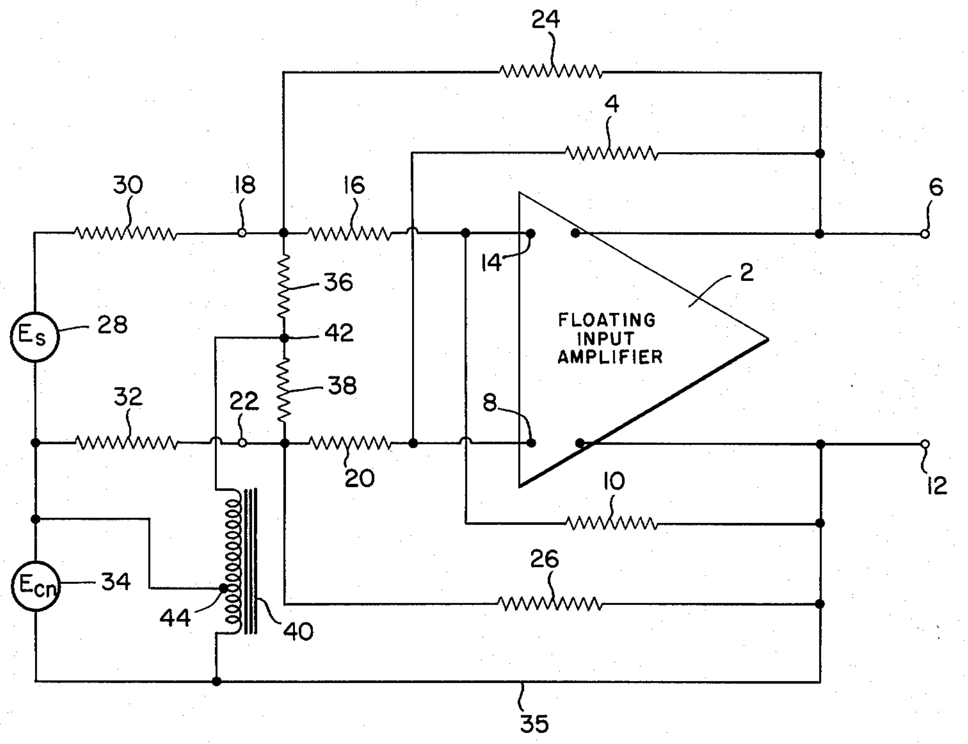
INVENTOR.
RICHARD S. BURWEN
BY Arthur H. Swanson
ATTORNEY.

3,209,277
Patented Sept. 28, 1965

3,209,277
ELECTRONIC APPARATUS

Richard S. Burwen, Lexington, Mass., assignor to Honeywell Inc., a corporation of Delaware Filed Sept. 15, 1961, Ser. No. 138,313
1 Claim. (Cl. 330—69)

This invention relates to electronic apparatus and more particularly to a differential input amplifier.

In the art relating to differential input amplifiers, efforts have heretofore been made to eliminate the effect of common-mode signals from the differential amplifier. Characteristically, in differential amplifiers the desired input signal is a pair of small voltage signals referenced to each other without respect to their relative magnitude referenced to ground, said signal being applied to the amplifier over a pair of input leads. Common-mode signals on the other hand, are characteristically spurious signals which are applied to both input leads and are frequently of a much larger magnitude than the desired signal. If the common-mode signal is equally divided between the two input leads as it is applied to the amplifier itself, then the common-mode signal will have little or no effect on the operation of the amplifier. To achieve such equal division between the two leads, it is essential that the impedance characteristic of the two leads be sufficiently closely matched as to be substantially identical with respect to the common-mode signal. This balance becomes particularly complicated when suitable feedback circuits are required to provide the necessary stabilization of the amplifier. One instance of such a circuit is shown in a co-pending application of the present inventor filed on Nov. 17, 1958, and bearing Ser. No. 774,368 entitled Electronic Apparatus. In that case the amplifier itself is embraced in a bridge-type network wherein the impedances associated with the amplifier as referred to the two input terminals of the amplifier are balanced with respect to the common-mode signals. While this circuit performs adequately for the purposes for which it was designed, it requires that the source impedance as applied to the two input leads also be balanced. It frequently occurs in practice that it is at least inconvenient if not impossible to provide balanced source impedances for application to such a balanced amplifier network.

It is accordingly an object of the present invention to provide an improved amplifier circuit which is characterized by an improved common-mode rejection.

It is a further object of the present invention to provide an improved amplifier circuit featuring improved common-mode rejection notwithstanding unbalanced source impedances.

In accomplishing these and other objects there has been provided, in accordance with the present invention, a differential input amplifier provided wtih a bridge-type impedance network. The common-mode signal is tapped off and fed to an injection network and applied to the input of the amplifier subsequent to the source impedance. This injection of the common-mode signal is arranged in such manner that the input terminals of the amplifier circuit are at the same common-mode potential as that applied to the input end of the source impedances. With this arrangement no potential difference due to common-mode signal appears across either of the source impedances. Thus no common-mode current flows through these impedances. With no common-mode current flowing through these impedances it matters not whether the two impedances are balanced or not, the common-mode signal which is presented to the input to the amplifier is balanced. Hence, the common-mode signal appearing on the two input leads is neutralized from the operation of the amplifier.

A better understanding of this invention may be had from the following detailed description when read in connection with the accompanied drawing in which the single figure is a schematic diagram illustrating a circuit embodying the present invention.

Referring now to the drawing in more detail there is shown in the figure a floating input differential amplifier 2. In this amplifier the input terminals are effectively isolated from the output terminal and neither of the input terminals are referred to ground. A first or negative feedback resistor 4 is connected between one of the amplifier output terminals 6 and one of the amplifier input terminals 8. A first balance resistor 10 is similarly connected between the second one of the amplifier output terminals 12 and the other one of the amplifier input terimnals 14. A first input resistor 16 is connected between the first system input terminal 18 and the second mentioned of the amplifier input terminals 14. A second input resistor 20 is connected between a second system input terminal 22 and the first mentioned of the amplifier input terminals 8. In order to enhance the high input impedance characteristic a positive feedback resistor 24 is connected between the amplifier output terminal 6 and the system input terminal 18. Again to maintain the balance of input impedances in the two legs, a corresponding balance impedance 26 is connected between the amplifier output terminal 12 and the system input terminal 22. The signal to be measured, that is the differential signal $E_s$ is represented schematically by a generator 28. The internal source impedance of this generator is represented by a source impedance resistor 30 shown in one leg of the input circuit and connected to the system input terminal 18, and a second source impedance resistor 32 shown in the other leg of the input circuit and connected to the system input terminal 22. The undesired common-mode signal $E_{cm}$ is represented schematically by the generator 34. The low side of the generator 34 is connected by a common bus 35 to the output terminal 12 of the amplifier. The other side of the generator 34 is connected to both legs of the input source represented by the generator 28 and the source impedances 30 and 32. So much of the circuit as has been thus far described is shown in the aforesaid co-pending application, Ser. No. 774,368 now U.S. Patent No. 3,088,076. In that circuit it may be seen that if the impedances represented by the resistor 30 and 32 are not balanced with the respect to remainder of the circuit then the common-mode signal from the generator 34 will produce a differential signal at the input terminals 18 and 22 which in turn will be applied to the amplifier 2 for amplification therein.

In order to overcome the necessity of having the source impedances 30 and 32 so accurately balanced a pair of accurately matched resistors 36 and 38 are serially connected between the system input terminals 18 and 22. An autotransformer 40 is connected between the common bus 35 and the mid-point 42 between the two resistors 36 and 38. A tap 44 on the autotransformer is connected to the opposite side of the generator 34 from the common bus 35.

In operation the differential signal $E_s$ from the source 28 is applied through the source impedances 30 and 32 to the input terminals 18 and 22 of the system. This signal is applied through the impedances represented by the resistors 16 and 20, to the input terminals 8 and 14 of the amplifier 2, where it is amplified in the normal manner. The feedback circuits provide the usual amplifier stabilization. The autotransformer 40 is so arranged that the common-mode signal applied between the tap 44 and the common bus 35 produces a three times multiplied signal at the other end of the autotransformer 40. This of course, produces a two times multiplied signal between the tap 44 and the upper end of the autotransformer 40.

The signal at the upper end of the transformer 40 is applied to the center tap 42 between the two resistors 36 and 38. Here the common-mode signal divides across the two resistors 36 and 38 and applies a signal at the system input terminals 18 and 22 which is equal to the superimposed common-mode signal applied from the generator 34 to the other side of the source impedances 30 and 32. With this arrangement no potential difference is presented, with respect to the common-mode signal, across either the source impedance 30 or the source impedance 32, hence no current flows through either of these impedances due to the common-mode signal, this notwithstanding the fact that the impedance 30 may not be equal to the impedance 32. With no current due to the common-mode signal flowing through the resistors 30 and 32, no differential voltage component due to common-mode signal would be applied to the input of the amplifier 2.

It will be recalled that the resistors 36 and 38 were carefully matched. With the common-mode signal being injected at the junction between these two resistors the balance of the circuit is preserved and the common-mode signal sums to zero at the input terminals 14 and 8 of the amplifier 2. The equality of the two resistors 36 and 38 can be readily controlled in the selection of components for the circuitry, whereas, as was previously pointed out, the impedances 30 and 32 which are the source impedances of the desired differential signal source, may frequently not be controlled. Accordingly, the novel features herein described have provided a means for maintaining a high degree of impedance balance thereby achieving a high order of common-mode rejection notwithstanding unbalance of the source impedances.

Thus there has been provided in accordance with the present invention an improved amplifier circuit featuring improved common-mode rejection even though there may be an unbalanced condition in the source impedances.

What is claimed is:

In a differential amplifier circuit having a balanced impedance and a pair of system input terminals for connection to a source of differential signals, said source presenting unbalanced impedances to said terminals, with an undesired common-mode signal being superimposed on said differential signals across said unbalanced impedances by a common-mode source connected to said impedances, the improvement comprising a pair of matched resistors connected serially between said terminals, and a signal multiplying autotransformer, one end of said autotransformer being connected to a point of common reference potential, the other end of said autotransformer being connected to the junction between said matched resistors, an input tap on said autotransformer for connection to a source of said common-mode signals at the connection to said unbalanced impedances of said common-mode source, said autotransformer being arranged to inject a signal to said junction between said matched resistors of such magnitude as to divide across said matched resistors to neutralize the effect of said superimposed common-mode signal.

References Cited by the Examiner

UNITED STATES PATENTS

| | | | |
|---|---|---|---|
| 2,941,155 | 6/60 | Lucas | 330—69 |
| 2,977,547 | 3/61 | Talambiras | 330—69 |

ROY LAKE, *Primary Examiner.*

NATHAN KAUFMAN, *Examiner.*